(12) United States Patent
Sawai

(10) Patent No.: US 9,089,053 B2
(45) Date of Patent: Jul. 21, 2015

(54) METHOD FOR MANUFACTURING WIRING SUBSTRATE

(75) Inventor: Mamoru Sawai, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 503 days.

(21) Appl. No.: 13/147,961

(22) PCT Filed: Apr. 27, 2010

(86) PCT No.: PCT/JP2010/057844
§ 371 (c)(1),
(2), (4) Date: Aug. 4, 2011

(87) PCT Pub. No.: WO2010/126160
PCT Pub. Date: Nov. 4, 2010

(65) Prior Publication Data
US 2011/0290535 A1    Dec. 1, 2011

(30) Foreign Application Priority Data

Apr. 27, 2009    (JP) ................. 2009-107746

(51) Int. Cl.
*H01K 3/10*    (2006.01)
*H05K 1/02*    (2006.01)
(Continued)

(52) U.S. Cl.
CPC ............... *H05K 1/0213* (2013.01); *H05K 3/40* (2013.01); *H05K 3/4092* (2013.01); *H05K 3/44* (2013.01);
(Continued)

(58) Field of Classification Search
CPC ........... H01L 23/498; H01L 23/49822; H01L 23/49827; H01L 23/49861; H01L 23/49534; H01L 24/49; H01L 25/0652; H01L 25/167; H01L 23/49568; H05K 3/40; H05K 3/44; H05K 1/0213; H05K 3/4092; H05K 1/056; H05K 2201/10924; H05K 2201/09754; Y10T 29/49158; Y10T 29/49165
USPC ............ 29/827, 832, 841, 846, 852; 174/262, 174/267; 361/778
See application file for complete search history.

(56) References Cited

U.S. PATENT DOCUMENTS

| 4,845,313 A | 7/1989 | Endoh et al. |
| 4,949,225 A | 8/1990 | Sagisaka et al. |

(Continued)

FOREIGN PATENT DOCUMENTS

| EP | 0567814 A1 | 4/1993 |
| JP | 62-22497 A | 1/1987 |

(Continued)

OTHER PUBLICATIONS

Office Action, dated Oct. 22, 2013, issued by the Japanese Patent Office in counterpart Japanese Patent Application No. 2009-107746.
(Continued)

*Primary Examiner* — Donghai D Nguyen
(74) *Attorney, Agent, or Firm* — Sughrue Mion, PLLC

(57) ABSTRACT

A wiring substrate includes a wiring board having a main face and a side face substantially perpendicular to the main face; a circuit pattern which is formed on the main face of the wiring board; a soaking plate which is disposed in an intermediate layer of the wiring board; and a plurality of protruding terminals are disposed in the intermediate layer and are projected outwardly from the side face. The protruding terminals are electrically connected in the intermediate layer to each other.

4 Claims, 7 Drawing Sheets

(51) Int. Cl.
  *H05K 3/40* (2006.01)
  *H05K 3/44* (2006.01)
  *H05K 1/05* (2006.01)

(52) U.S. Cl.
  CPC ...... *H05K 1/056* (2013.01); *H05K 2201/09754* (2013.01); *H05K 2201/10924* (2013.01); *Y10T 29/49158* (2015.01); *Y10T 29/49165* (2015.01)

(56) References Cited

U.S. PATENT DOCUMENTS

| | | | |
|---|---|---|---|
| 5,250,470 A * | 10/1993 | Yamaguchi | 29/832 |
| 5,274,197 A * | 12/1993 | Kondo et al. | 174/267 |
| 5,311,407 A | 5/1994 | Lumbard | |
| 5,357,674 A | 10/1994 | Lumbard | |
| 8,365,397 B2 * | 2/2013 | Garrison | 29/827 |
| 2009/0035957 A1 | 2/2009 | Garrison | |

FOREIGN PATENT DOCUMENTS

| | | |
|---|---|---|
| JP | H01-199497 A | 8/1989 |
| JP | 2-121358 A | 5/1990 |
| JP | H06-069402 A | 3/1994 |
| JP | 7-74284 A | 3/1995 |
| JP | 11-26625 A | 1/1999 |
| JP | 2007-281138 A | 10/2007 |

OTHER PUBLICATIONS

Communication, dated Oct. 10, 2013, issued by the European Patent Office in counterpart European Application No. 10 720 314.3.
International Search Report (PCT/ISA/210) issued on Oct. 18, 2010 in the International Patent Application No. PCT/JP2010/057844.
Written Opinion of the International Searching Authority (PCT/ISA/237) issued on Oct. 18, 2010 in the International Patent Application No. PCT/JP2010/057844.
Communication dated Mar. 26, 2013 from the Japanese Patent Office in counterpart application No. 2009-107746.
Office Action dated Aug. 11, 2014 issued by the State Intellectual Property Office of the People's Republic of China in counterpart Chinese Patent Application No. 201080009407.0.
Office Action dated Feb. 12, 2014 issued by the State Intellectual Property Office of P.R. China in corresponding Chinese Application No. 201080009407.0.
Communication issued on Feb. 27, 2015 by the State Intellectual Property Office of PR China in related application No. 201080009407.0.

* cited by examiner

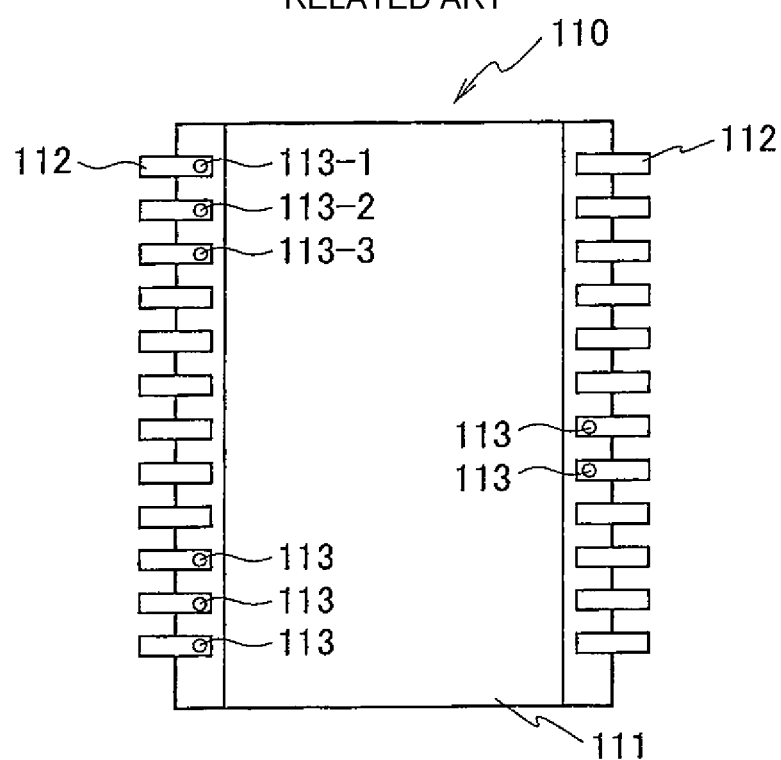

METHOD FOR MANUFACTURING WIRING SUBSTRATE

CROSS-REFERENCE TO RELATED APPLICATIONS

This application is a National Stage entry of International Application PCT/JP2010/057844 filed Apr. 27, 2010, which claims the benefit of Application No. JP 2009-107746 filed Apr. 27, 2009, in the Japanese Patent Office (JPO), the disclosures of which are incorporated herein in their entirety.

TECHNICAL FIELD

The present invention relates to a wiring substrate including a soaking plate and a manufacturing method of the wiring substrate, and particularly to a technique for reducing electric wires for connecting terminals on a face of the wiring substrate.

BACKGROUND ART

For example, a wiring substrate installed in an electrical distribution box of a vehicle uses the wiring substrate configured to dispose a metal plate (soaking plate or heat dissipation plate) in an intermediate layer of the wiring substrate in order to avoid a local increase in temperature by heat generation of an electronic component (for example, see PTL 1). By using such a metal plate, the heat generated in the electronic component is diffused in the whole wiring substrate and thus a heat dissipation effect is promoted, so that damage to a circuit pattern and the electronic component by the local increase in temperature can be prevented.

FIGS. 10 and 11 are explanatory diagrams showing a configuration of a related wiring substrate 110, and FIG. 10 shows a surface layer and FIG. 11 shows an intermediate layer (that is, an inside layer excluding the surface layer), respectively. As shown in FIG. 11, a metal plate 111 having conductivity is disposed in substantially the center of the intermediate layer of the wiring substrate 110. Also, a plurality of protruding terminals 112 (12 pieces in the drawings) having rectangular shapes are respectively disposed in the left lateral side part and the right lateral side part of the wiring substrate 110, and a part of each of the protruding terminals 112 protrudes toward the outside of the wiring substrate 110. Then, when a connector (not shown) is connected to the wiring substrate 110, this protruding portion can be used as a terminal for connector connection.

Also, as shown in FIG. 10, a prepreg 131, which is an insulating material, is disposed on a face of the wiring substrate 110 and the surface layer is formed. On this surface layer, various electronic components 115 are installed and a circuit pattern 114 is cabled. Further, in order to connect the circuit pattern 114 disposed in the surface layer to the protruding terminals 112 disposed in the intermediate layer, through holes 113 are bored in at least one of the plural protruding terminals 112 (see FIG. 11). That is, the protruding terminals 112 can be electrically connected to the circuit pattern 114 via the conductive through holes 113.

Also, for example, in the case of electrically connecting three through holes 113-1, 113-2, 113-3 shown in the upper left of FIG. 10, it is necessary to provide circuit patterns 114-1, 114-2 for making connection between each of the through holes 113-1, 113-2, 113-3 on the surface layer of the wiring substrate 110. The circuit patterns 114 formed on the surface layer of the wiring substrate 110 increase and a problem of reducing space for arranging the electronic components by the increased circuit patterns arises.

CITATION LIST

Patent Literature
[PTL 1] JP-A-2007-281138

SUMMARY OF INVENTION

Technical Problem

As described above, in the related wiring substrate 110, the plural protruding terminals 112 are formed in the same layer as the metal plate 111, and the through holes 113 are disposed in at least one of the protruding terminals 112, and the circuit patterns 114 formed on the surface layer are connected to the protruding terminals 112 via the through holes 113. Then, in the case of making electrical connection between the plural protruding terminals 112, it is necessary to form the circuit patterns 114 (114-1, 114-2, etc. shown in FIG. 10) on the surface layer of the wiring substrate 110, so that there is a disadvantage in that space on the wiring substrate 110 cannot be used effectively, and the demand that the space on the wiring substrate 110 want to be effectively utilized is increasing.

The invention has been implemented to solve such a related problem, and an object of the invention is to provide a wiring substrate including a soaking plate capable of effectively utilizing space on the wiring substrate by reducing a circuit pattern disposed in a surface layer of the wiring substrate, and a manufacturing method of the wiring substrate.

In order to achieve the above object, according to the present invention, there is provided a wiring substrate, comprising:

a wiring board that has a main face and a side face substantially perpendicular to the main face;

a circuit pattern that is formed on the main face of the wiring board;

a soaking plate that is disposed in an intermediate layer of the wiring board; and a plurality of protruding terminals that are disposed in the intermediate layer and are projected outwardly from the side face, wherein the protruding terminals are electrically connected in the intermediate layer to each other.

Preferably, the wiring substrate further includes other protruding terminal that is disposed in the intermediate layer and is projected outwardly from the side face, the other protruding terminal is separated from the plurality of protruding terminals.

Preferably, a through hole for electrically connecting the protruding terminals to the circuit pattern is communicated from the main face to the intermediate layer.

Preferably, the soaking plate, which is comprised of a conductive material, is electrically connected to the circuit pattern.

According to the present invention, there is also provided a method for manufacturing a wiring substrate, comprising:

processing a metal flat plate in a shape of a plurality of protruding terminals and a soaking plate; and forming a resin layer on at least one of a front side and a rear side of the metal flat plate having the protruding terminals and the soaking plate so that a part of each of the protruding terminals protrudes to the outside of the resin layer, wherein in the processing process, the protruding terminals are processed so as to be mutually connected in the resin layer.

Preferably, the method further includes: forming a through hole, which is communicated from a surface of the resin layer to a part of the protruding terminals, in the resin layer.

Advantageous Effects of Invention

By the above configuration, the plural protruding terminals disposed in the intermediate layer are mutually connected, so that it is unnecessary to form the circuit pattern for connecting the protruding terminals on the main face and the circuit pattern on the main face can be reduced. As a result, space of the main face can be utilized effectively and the space for installing various electronic components can be obtained widely.

By the above configuration, when the through hole is formed from the main face to the intermediate layer and the protruding terminals are connected to the circuit pattern disposed on the main face via the through hole, the number of through holes can be reduced and the space of the main surface of the wiring substrate can be utilized effectively.

By the above configuration, the soaking plate (metal plate) is used as a conductor and is connected to the circuit pattern, so that connection between the circuit pattern and the soaking plate can easily be made by using the soaking plate.

By the above method, the soaking plate and the protruding terminals can be fabricated in the same step, so that the wiring substrate can be manufactured by a simple procedure.

BRIEF DESCRIPTION OF DRAWINGS

FIG. 11 is an explanatory diagram showing a configuration of an intermediate layer of the related wiring substrate.

DESCRIPTION OF EMBODIMENTS

Figure 1:
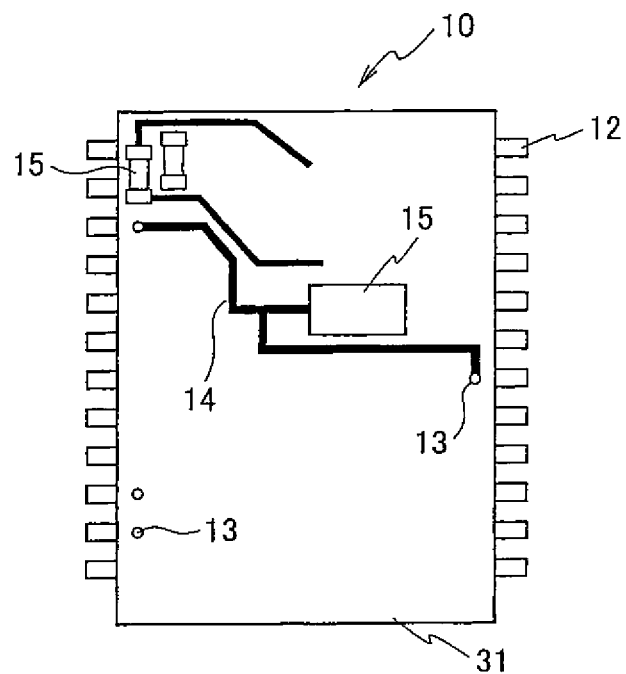
FIG. 1 is an explanatory diagram showing a configuration of a surface layer of a wiring substrate according to an embodiment of the invention.

An embodiment of the invention will hereinafter be described based on the drawings. FIG. 1 is an explanatory diagram showing a surface layer of a wiring substrate 10 according to one embodiment of the invention, and FIG. 2 is an explanatory diagram showing an intermediate layer (that is, a layer excluding the surface layer).

Figure 2:
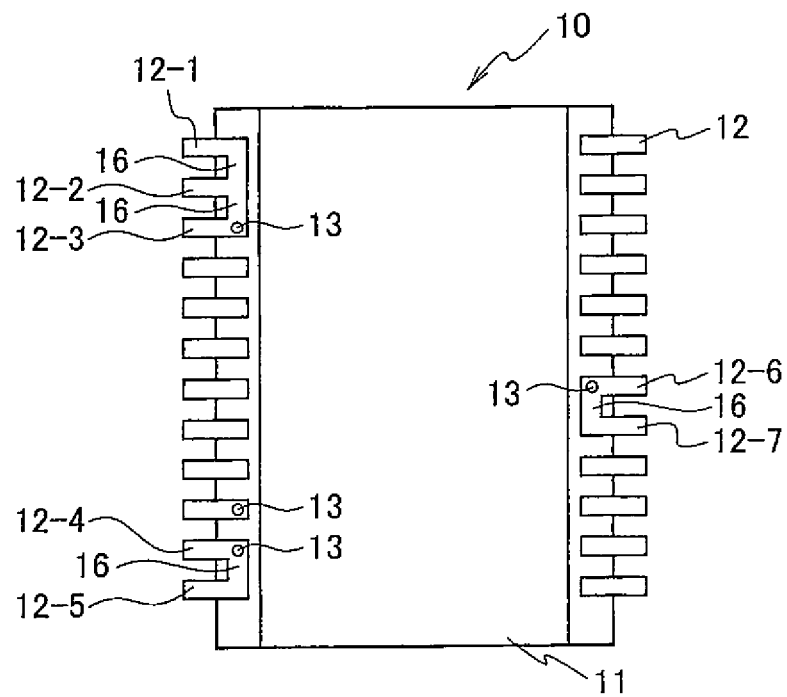
FIG. 2 is an explanatory diagram showing a configuration of an intermediate layer of the wiring substrate according to the embodiment of the invention.

As shown in FIG. 2, a rectangular metal plate (soaking plate or heat dissipation plate) 11 is disposed in substantially the center of the intermediate layer of the wiring substrate 10. The metal plate 11 is made of a metallic material and has conductivity.

Also, a plurality of protruding terminals 12 (12 pieces in the drawings) having rectangular shapes are respectively disposed in the left lateral side part and the right lateral side part of the wiring substrate 10, and a part of each of the protruding terminals 12 protrudes to the outside of the wiring substrate 10. Then, when a connector (not shown) is connected to the wiring substrate 10, the protruding portions of the protruding terminals 12 can be used as a terminal. In addition, when it is necessary to individually distinguish each of the protruding terminals 12, each of the protruding terminals 12 is represented by assigning a suffix "-n".

Some of the protruding terminals 12 are mutually connected through joint portions 16. Concretely, the protruding terminals 12-1, 12-2, 12-3 shown in FIG. 2 are mutually connected by the joint portions 16 and the protruding terminals 12-4, 12-5 are mutually connected by the joint portion 16 and further, the protruding terminals 12-6, 12-7 are mutually connected by the joint portion 16.

As shown in FIG. 1, a prepreg 31, which is an insulating material, is disposed on a face of the wiring substrate 10 as a surface layer of the wiring substrate 10. On the surface layer, various electronic components 15 are mounted and a circuit pattern 14 is also formed. Also, in order to connect the circuit pattern 14 disposed on the face of the wiring substrate 10 to the protruding terminals 12 disposed in the intermediate layer, through holes 13 are formed in at least one of the plural protruding terminals 12 (see FIG. 2). That is, the protruding terminals 12 can be electrically connected to the circuit pattern 14 formed on the surface layer via the conductive through holes 13.

In this example, the through hole 13 is formed in only one protruding terminal 12-3 of the three protruding terminals 12-1, 12-2, 12-3, and the through hole 13 is not formed in the other protruding terminals 12-1, 12-2. Similarly, the through hole 13 is formed in only one protruding terminal 12-4 of the two protruding terminals 12-4, 12-5, and the through hole 13 is formed in only one protruding terminal 12-6 of the two protruding terminals 12-6, 12-7.

Figure 10:
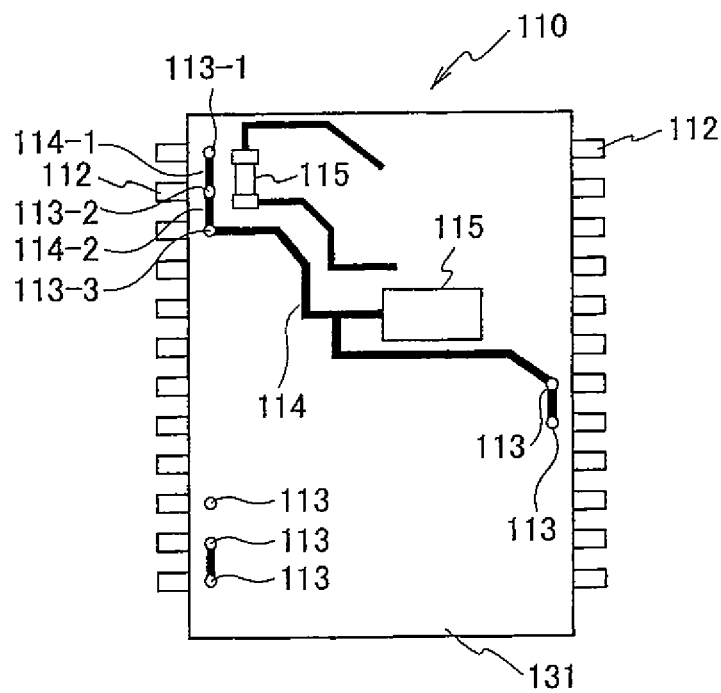
FIG. 10 is an explanatory diagram showing a configuration of a surface layer of a related wiring substrate.

That is, in the related wiring substrate 110 shown in FIGS. 10 and 11, each of the protruding terminals 112 disposed in the intermediate layer is respectively separated, so that it is necessary to form the circuit patterns 114-1, 114-2 (see FIG. 10), etc. on the surface layer in order to electrically connect these protruding terminals 112, but in the embodiment, the three protruding terminals 12-1, 12-2, 12-3 are connected in the intermediate layer by the joint portions 16 as shown in FIG. 2, so that it is unnecessary to form the through holes 13 in all the three protruding terminals 12-1, 12-2, 12-3 and it is unnecessary to form the circuit pattern for connection on the surface layer.

Therefore, as shown in FIG. 1, the circuit pattern 14 formed on the surface layer can be reduced and accordingly, more electronic components 15 can be disposed on the wiring substrate 10.

Next, a procedure for manufacturing the wiring substrate 10 mentioned above will be described with reference to explanatory diagrams shown in FIGS. 3 to 7B and a flowchart shown in FIG. 8. In addition, in the explanatory diagrams shown in FIGS. 3 to 7B, the number of protruding terminals 12 is set at five pieces in the right and left sides in order to simplify the explanation.

Figure 3:
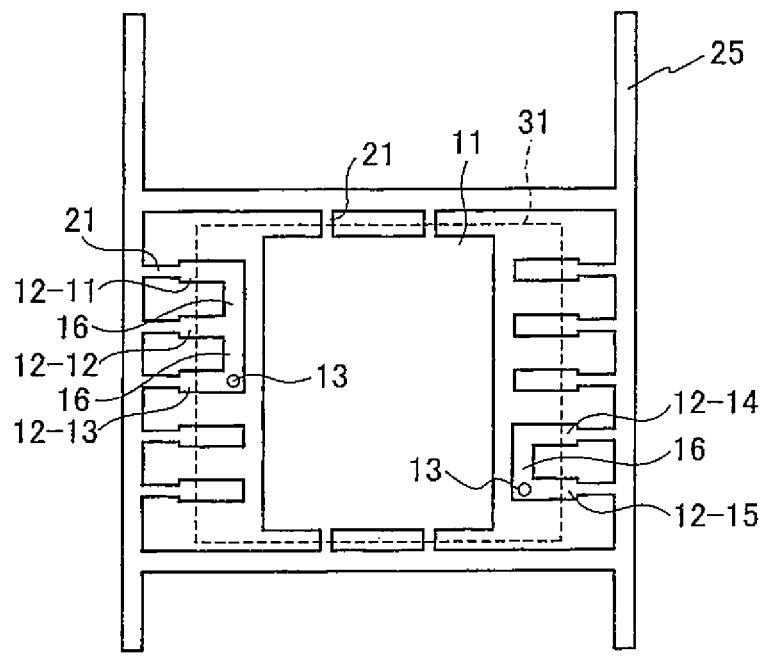
FIG. 3 is an explanatory diagram showing a procedure for fabricating the wiring substrate according to the embodiment of the invention, and shows a step of processing a metal plate.
Figure 8:
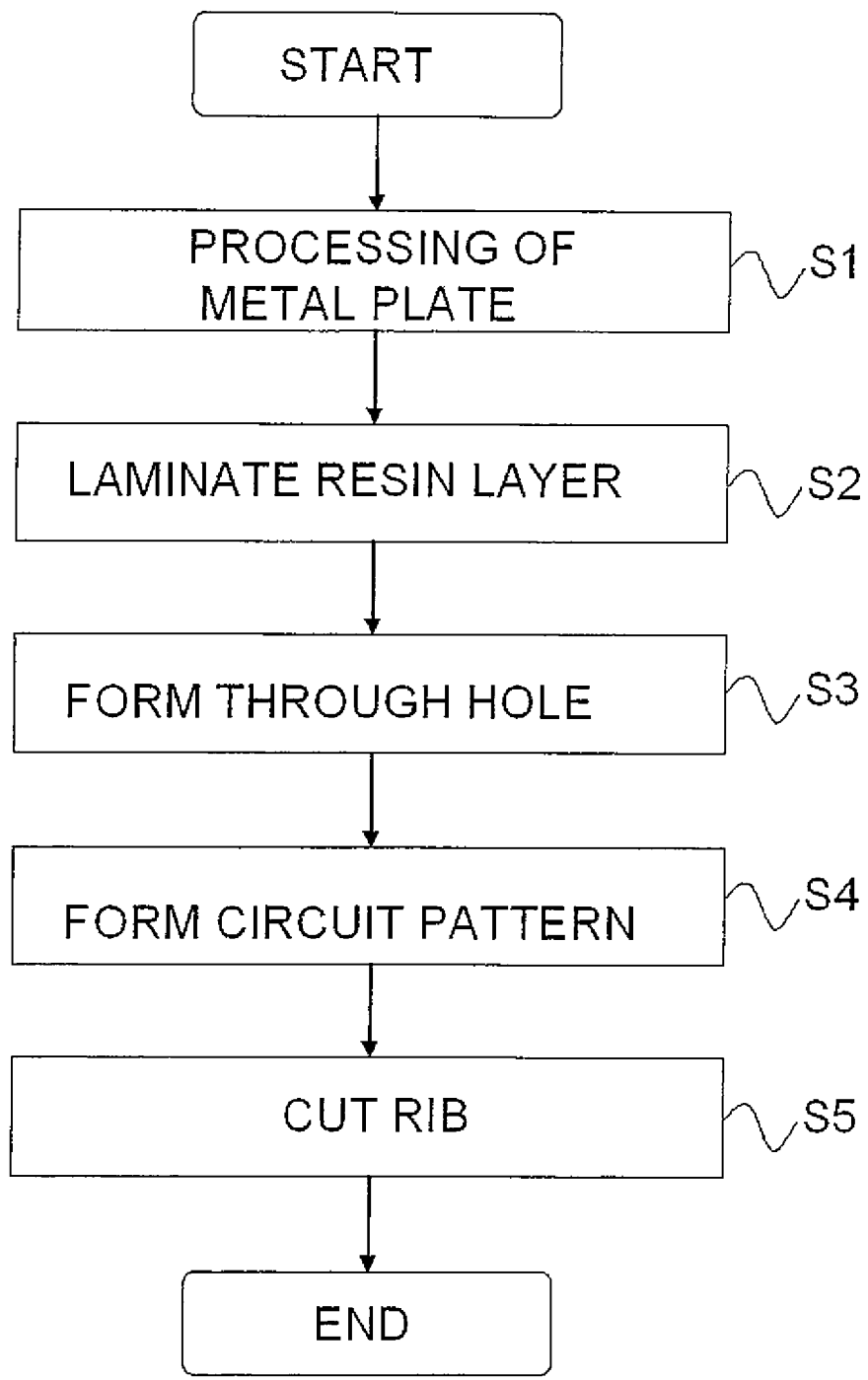
FIG. 8 is a flowchart showing a procedure for fabricating the wiring substrate according to the embodiment of the invention.

First, a metal plate 25 used as material of the metal plate 11 and the protruding terminals 12 is processed in a shape as shown in FIG. 3 by etching or press processing (step S1 of FIG. 8; first step). Concretely, the rectangular metal plate (soaking plate) 11 and the protruding terminals 12 respectively disposed five by five in the right and left sides are formed and further, the joint portions 16 for connecting the protruding terminals 12-11, 12-12, 12-13 are formed and the joint portions 16 for connecting the protruding terminals 12-14, 12-15 are formed. In addition, in the example shown in FIG. 3, a configuration of separating the metal plate 11 and each of the protruding terminals 12 is adopted, but a configuration of connecting the metal plate 11 and at least one protruding terminal 12 can also be adopted according to use application as described below.

Figure 4:
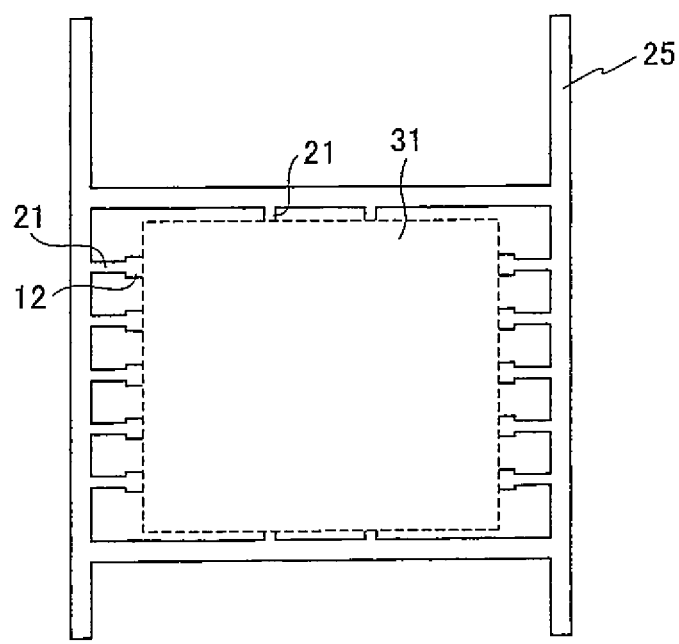
FIG. 4 is an explanatory diagram showing a procedure for fabricating the wiring substrate according to the embodiment of the invention, and shows a step of laminating a prepreg.

Next, as shown in FIG. 4, the prepreg (resin layer) 31 including metal foil is laminated on one face or both faces of the metal plate 25 and the prepreg 31 is heated and pressed to form an external shape of the wiring substrate 10 (step S2; second step).

Figure 5:
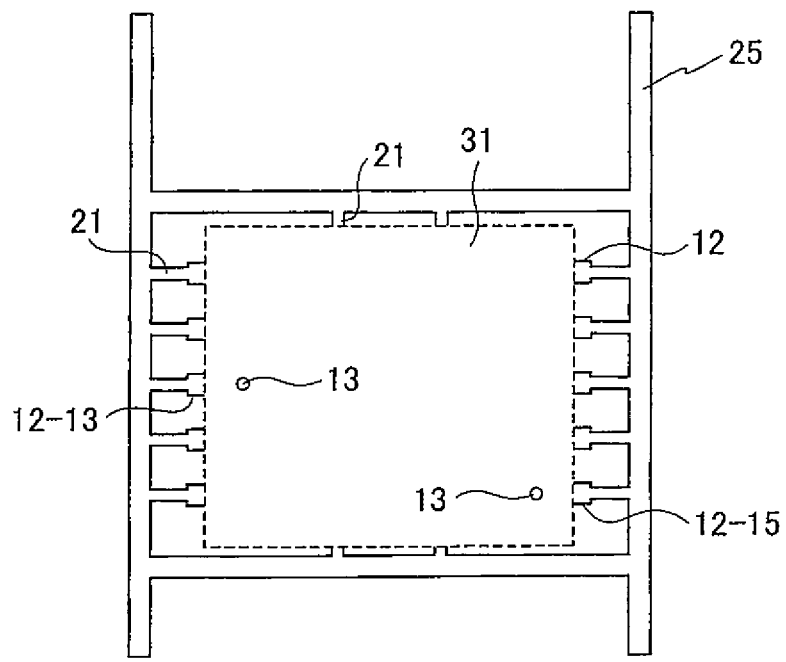
FIG. 5 is an explanatory diagram showing a procedure for fabricating the wiring substrate according to the embodiment of the invention, and shows a step of forming a through hole.

As shown in FIG. 5, the through holes 13 for connecting a face of the prepreg 31 to the desired protruding terminals 12-13, 12-15 are formed, and further the through holes 13 are plated to make an electrical conduction state (step S3).

Figure 6:
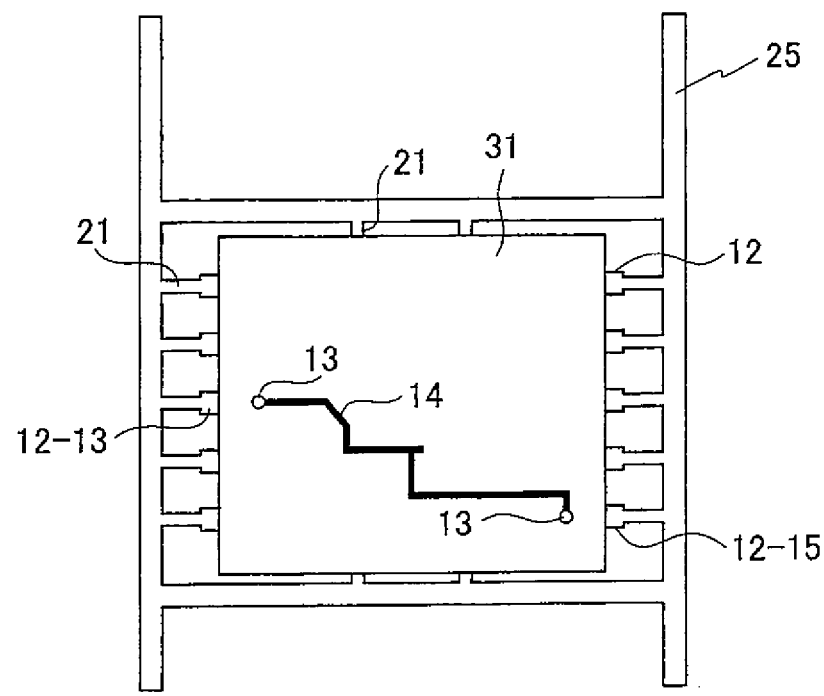
FIG. 6 is an explanatory diagram showing a procedure for fabricating the wiring substrate according to the embodiment of the invention, and showing a step of forming a circuit pattern.

Thereafter, a circuit pattern is masked on the face of the prepreg 31 and is etched to form the desired circuit pattern 14 (step S4). As a result of this process, the wiring substrate 10 having the circuit pattern 14 and the through holes 13 is formed as shown in FIG. 6.

Figure 7A:
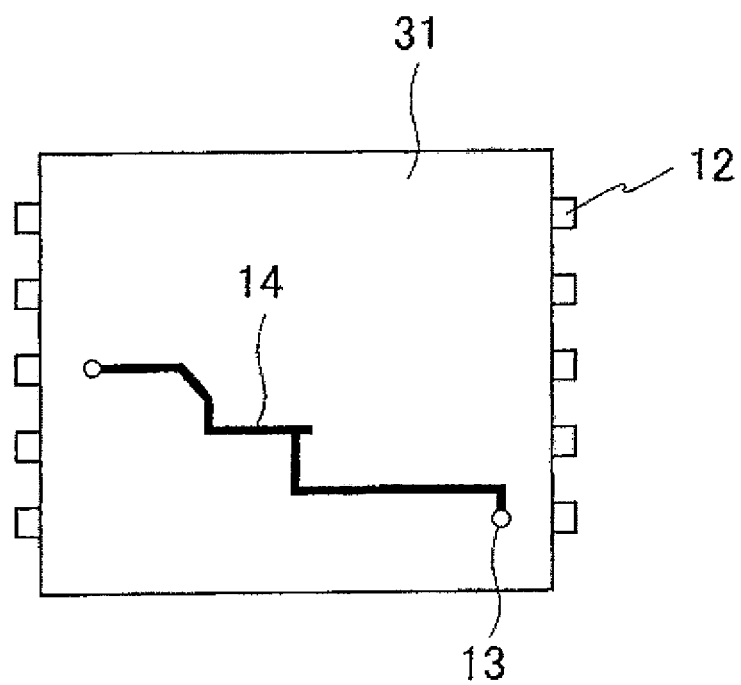
FIGS. 7A and 7B are explanatory diagrams showing procedures for fabricating the wiring substrate according to the embodiment of the invention, and showing a step of cutting a rib and forming the final wiring substrate.
Figure 7B:
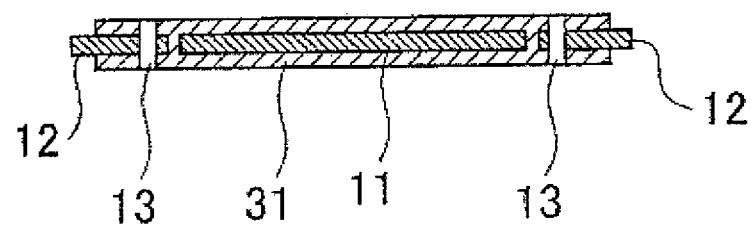

Then, as shown in a plan view of FIG. 7A and a front view (sectional view) of FIG. 7B, ribs 21 (see FIG. 6) of the periphery of the protruding terminals 12 and the metal plate 11 are cut by press or a router, etc. (step S5). Thus, the wiring substrate 10, in which the metal plate 11 and the protruding terminals 12 are disposed in the intermediate layer and the through holes 13 are bored, can be fabricated.

In the wiring substrate 10 according to the embodiment, at least two of the plural protruding terminals 12 disposed in the intermediate layer are mutually connected by the joint portion 16, so that it is unnecessary to form the circuit pattern 14 for connecting the two protruding terminals 12 on the surface layer, and the circuit pattern on the surface layer can be reduced. As a result, space of the surface layer can be utilized effectively and the space for installing various electronic components 15 can be obtained widely.

Also, when the through holes 13 are formed in the protruding terminals 12 and the protruding terminals 12 are connected to the circuit pattern 14 on the surface layer via the through holes 13, the number of through holes 13 can be reduced and the space of the surface layer of the wiring substrate 10 can be utilized effectively.

Further, the metal plate 11 is used as a conductor and is used for connection to the circuit pattern 14, so that connection between the circuit pattern 14 and the metal plate 11 can be easily made by using the metal plate 11.

Figure 9:
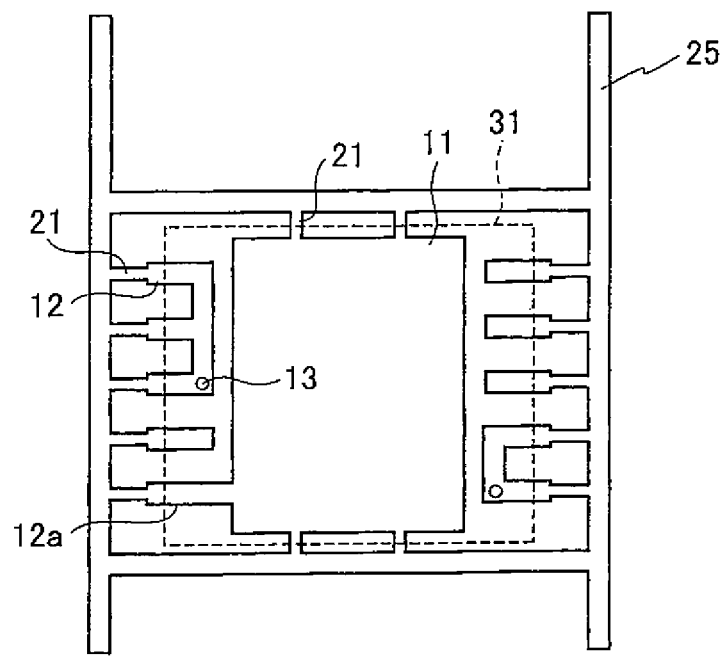
FIG. 9 is an explanatory diagram showing a modified example of the wiring substrate according to the embodiment of the invention.

In addition, in the embodiment described above, the example configured to respectively separate the metal plate 11 from the plural protruding terminals 12 has been described, but the metal plate 11 itself can also be used as an electrode by connecting the metal plate 11 to at least one protruding terminal 12 as shown in FIG. 9. In this case, for example, ground connection can easily be made in the case of cabling the circuit pattern 14 by using the metal plate 11 as a ground terminal.

The wiring substrate including the soaking plate and the manufacturing method of the wiring substrate of the invention have been described above based on the illustrated embodiment, but the invention is not limited to this, and a configuration of each part can be replaced with any configuration having a similar function.

For example, the embodiment described above has been described by taking the wiring substrate installed in the electrical distribution box of the vehicle as an example, but the invention is not limited to this, and can be applied to other wiring substrates.

The present application is based on Japanese Patent Application No. 2009-107746 filed on Apr. 27, 2009, the contents of which are incorporated herein by reference.

Industrial Applicability

The invention is extremely useful in effectively using space of a surface layer of a wiring substrate.

Reference Signs List 10 wiring substrate
11 metal plate
12 protruding terminal
13 through hole
14 circuit pattern
15 electronic component
16 joint
21 rib
25 metal plate
31 prepreg
110 wiring substrate
111 metal plate
112 protruding terminal
113 through hole
114 circuit pattern
115 electronic component
131 prepreg

The invention claimed is:

1. A method for manufacturing a wiring substrate, comprising:
    processing a metal flat plate in a shape of a plurality of protruding terminals and a soaking plate;
    after the processing, forming a resin layer on at least one of a front side and a rear side of the metal flat plate having the protruding terminals and the soaking plate so that a part of each of the protruding terminals protrudes to the outside of the resin layer; and
    after the forming the resin layer, forming a through hole, which is communicated from a surface of the resin layer to a part of a set of the protruding terminals, in the resin layer,
    wherein in the processing process, the protruding terminals are processed so that a part of the set of protruding terminals are mutually connected in the resin layer and another part of remaining protruding terminals are not mutually connected in the resin layer.

2. The method of claim 1, further comprising:
    after the forming the resin layer, masking a circuit pattern on the resin layer.

3. The method of claim 2, further comprising:
    after the masking, cutting at least one rib in a periphery of the protruding terminals and the metal flat plate.

4. The method of claim 2, wherein in the processing process, the protruding terminals are processed so as not to be connected to the soaking plate in the resin layer.

* * * * *